Patent Number: 4,559,507
Date of Patent: Dec. 17, 1985

United States Patent [19]
Ramsdale et al.

[54] CONTROLLED HYBRID MICROCIRCUIT OSCILLATOR

[75] Inventors: Kurt A. Ramsdale; Richard M. Harter, both of Vergennes, Vt.

[73] Assignee: Simmonds Precision Products, Inc., Tarrytown, N.Y.

[21] Appl. No.: 528,574

[22] Filed: Sep. 1, 1983

[51] Int. Cl.⁴ .............................................. H03L 5/00
[52] U.S. Cl. ...................................... 331/183; 328/175; 73/304 C; 324/61 R
[58] Field of Search ....................... 331/109, 182, 183; 328/168, 172, 175; 73/304 C; 324/61 R, 60 R, 60 C; 361/284; 307/264

[56] References Cited

U.S. PATENT DOCUMENTS

| | | | |
|---|---|---|---|
| 3,187,269 | 6/1965 | Runyan | 331/183 X |
| 3,533,286 | 10/1970 | Westcott et al. | 73/304 C |
| 3,580,074 | 5/1971 | Westcott | 73/304 C |
| 3,901,079 | 8/1975 | Vogel | 73/304 C |
| 4,086,528 | 4/1978 | Walton | 324/61 R |
| 4,259,865 | 4/1981 | Myers | 73/304 C |

Primary Examiner—Eugene R. LaRoche
Assistant Examiner—Robert J. Pascal
Attorney, Agent, or Firm—Cushman, Darby & Cushman

[57] ABSTRACT

An AC signal source having constant frequency-amplitude product is also easily realizable in hybrid microcircuit form. A square wave oscillator output is rectified and clamped to a feedback control voltage. The resulting controlled amplitude square wave is low-pass filtered to produce a sinusoidal output signal which is typically amplified and applied to a variable-impedance load. The sinusoidal signal is also applied to a similar but simulated load of fixed impedance value and the current flowing through the simulated load is summed with a temperature-compensated reference current producing an error current which is then integrated to produce the feedback control voltage which controls the amplitude of the sinusoidal signal so as to maintain a constant frequency amplitude product.

9 Claims, 6 Drawing Figures

CONTROLLED HYBRID MICROCIRCUIT OSCILLATOR

FIELD OF THE INVENTION

The invention relates to a controlled oscillator especially suited for the hybrid microcircuit form to provide an AC source having an output with a constant frequency-amplitude product. Such sources are especially useful in the measurement of AC impedances exposed to varying ambient conditions.

BACKGROUND OF THE INVENTION

The electrical impedance of an element can be measured by connecting an alternating current signal of fixed frequency and amplitude to the element and measuring the current flowing through the element. However, AC current flowing through an element of fixed impedance will also change if the frequency, amplitude or harmonic content of the AC excitation signal changes.

One known method to ensure accurate impedance measurements is to utilize an AC signal source which is highly stable in frequency, amplitude and harmonic content. Stable sources of this type are often very expensive. Yet, it is only necessary for accurate impedance measurement that the total current flowing through the impedance be constant (i.e. unique) for a given impedance value. It is therefore possible to compensate for shifts in amplitude, frequency and harmonic content of the excitation signal by merely controlling the amplitude of the electrical test signal. Using this technique, the signal source need not be exceptionally stabilized in any one of (a) output frequency, (b) harmonic content or (c) amplitude because the output signal is automatically amplitude-corrected to compensate for any shifts in these parameters.

The prior art generally discloses such an amplitude-corrected alternating current signal source for providing test excitation to a variable impedance element. For example, Wescott et al (U.S. Pat. No. 3,533,286, issued Oct. 13, 1970) and Vogel (U.S. Pat. No. 3,901,079, issued Aug. 26, 1975) disclose tank quantity gauges using a capacitive sensor to sense liquid level in a tank. An AC oscillator is used to provide excitation to the capacitive sensor. A control signal is fed back to a control input of the oscillator to change the amplitude of the oscillator output voltage to compensate for changes in the dielectric constant of the liquid sensed.

Wescott et al (U.S. Pat. No. 3,580,074, issued May 25, 1971) discloses a similar capacitive sensor liquid level gauge in which a control signal dependent upon the temperature and dielectric constant of the liquid in the tank is applied to a control input of the oscillator.

Myers (U.S. Pat. No. 4,259,865, issued Apr. 7, 1981) discloses a fluid gauging system utilizing a capacitive sensing unit the capacitance of which varies according to liquid level. The sensing unit is connected to the sinusoidal output of an oscillator. The capacitance of the sensing unit is measured indirectly by measuring the current induced to flow through the sensing unit by the excitation signal.

A fixed capacitor in Myers is also connected to the oscillator and the current flowing through the fixed capacitor is sampled. Any changes in the current flowing through the fixed capacitor are attributed to changes in the excitation signal. The sampled current is first scaled and filtered and the resulting direct current voltage is then compared to a fixed reference voltage. The difference signal generated is used to control the amplitude of the oscillator output (in some way not shown) to compensate for the changes in the current flowing through the fixed capacitor. As a result, any changes in current flowing through the capacitive sensor are attributable solely to changes in the capacitance of the sensor. Although Myers also teaches a form of temperature compensation by placing the fixed reference capacitor in the same fuel tank environment as the variable level measuring capacitor, this is not in reality a practical alternative because such extra electrical elements are normally not permitted in the fuel tank (e.g. due to added air frame wiring requirements).

Prior art systems such as Myers thus have several disadvantages. For example, the Myers system requires two active elements just to generate the oscillator control signal. Perhaps more importantly, no practical compensation for changes in output signal resulting from temperature variations within the signal conditioning is provided. Furthermore, the overall oscillator and feedback control circuit of such prior art may not be readily realized in hybrid microcircuit form—depending upon the details of circuitry not shown. The present invention has none of these disadvantages.

BRIEF SUMMARY OF THE INVENTION

A controlled hybrid microcircuit oscillator in accordance with the presently preferred exemplary embodiment of the invention provides an AC output signal having a constant frequency-amplitude product. A square wave AC signal of a desired output frequency is generated. A low-pass filter extracts the fundamental sinusoidal waveform from the square wave signal. An output driver amplifier matches the sinusoidal signal to the expected load impedance. The output signal is also continually fed back to an oscillator control input to provide voltage-frequency stability.

A feedback network providing the desired stability in the exemplary embodiment comprises a voltage-frequency to current converter, the output of which is simply subtracted (e.g. at a summing node) from a constant reference current and the difference or error current integrated to produce the DC feedback control voltage. The feedback voltage is summed with a square wave signal to control the amplitude of the output sinusoidal signal. The configuration of the circuitry is simplified to yield a reliable, costeffective design which readily lends itself to hybridization.

In the presently preferred embodiment, a square wave oscillator is used to generate a square wave alternating current signal. This square wave signal is fed to a summing node through a clamping diode and the DC feedback control voltage then clamps the square wave signal at its lower or upper limit to directly determine the peak-to-peak amplitude of the signal at that point. The summed and thus limited square wave signal is then filtered by a low-pass filter to convert it to a sinusoidal signal. An output amplifier amplifies the sinusoidal signal as required and provides a desirable low impedance output. The amplified signal may then be applied to an element the impedance of which is to be measured.

A special temperature compensation circuit is also provided in the exemplary embodiment. It is associated with the reference current source summing node and provides a simple practical (i.e. usable) solution to most of the errors in impedance measurement caused by temperature changes and/or differences in the signal conditioning unit.

These as well as other objects and advantages of this invention will be better appreciated by studying the following detailed description of the presently preferred exemplary embodiment of this invention in conjunction with the accompanying drawings.

DETAILED DESCRIPTION OF THE PREFERRED EMBODIMENT

Figure 1:
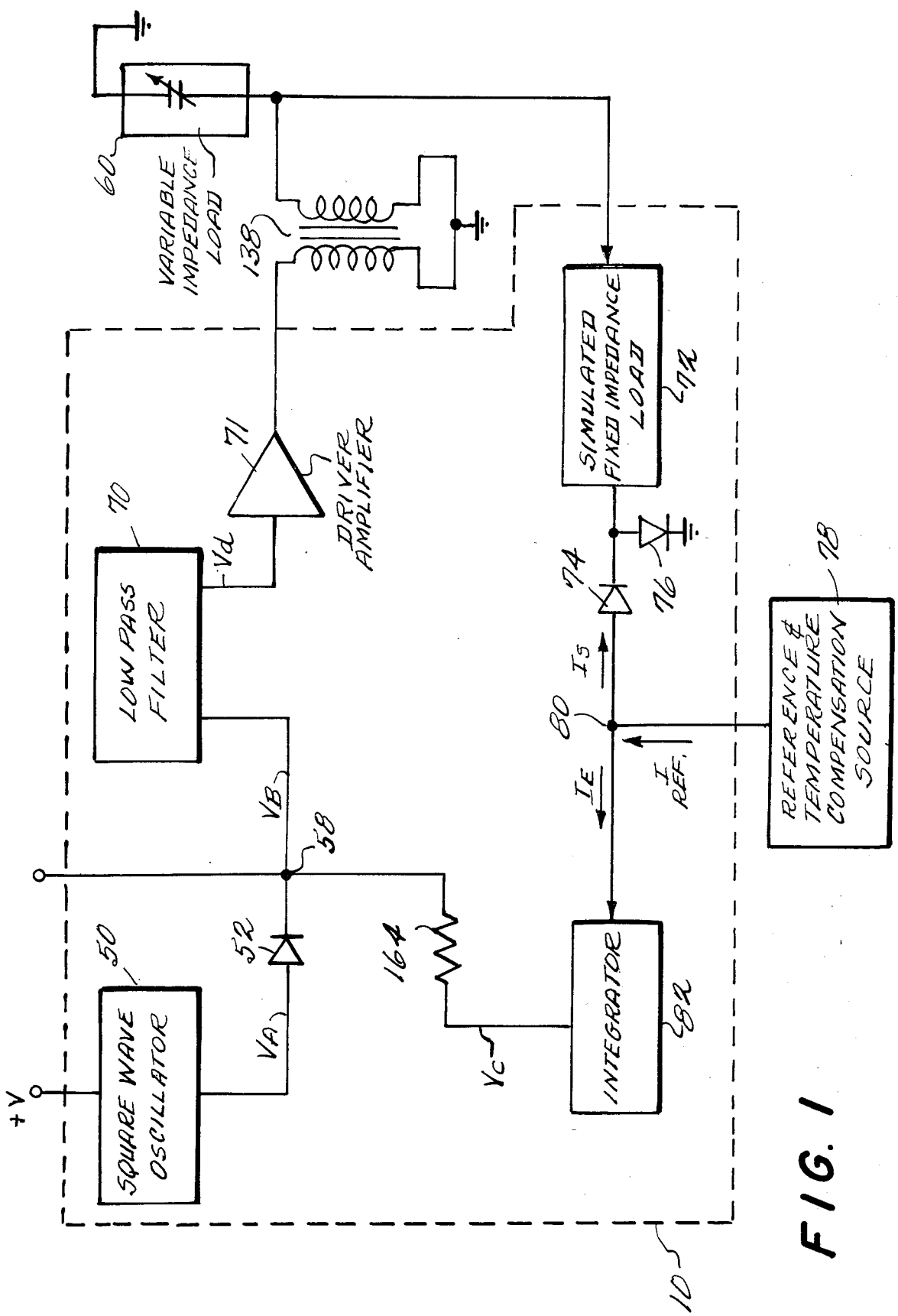
FIG. 1 is a block diagram of a presently preferred exemplary embodiment of the invention.
Figure 2A:
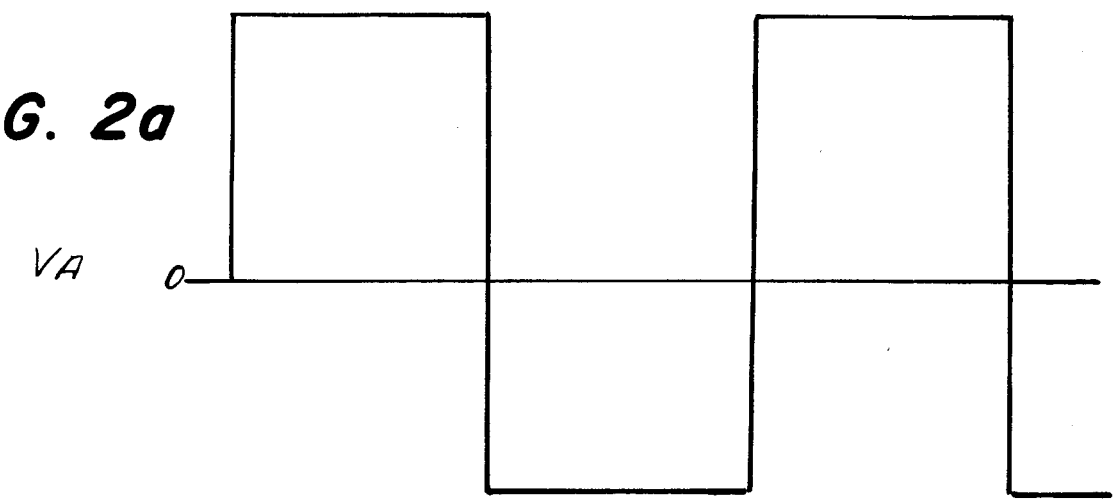
FIGS. 2(a)–2(d) are waveform diagrams of signals appearing at various points in the exemplary embodiment of FIG. 1.
Figure 2B:
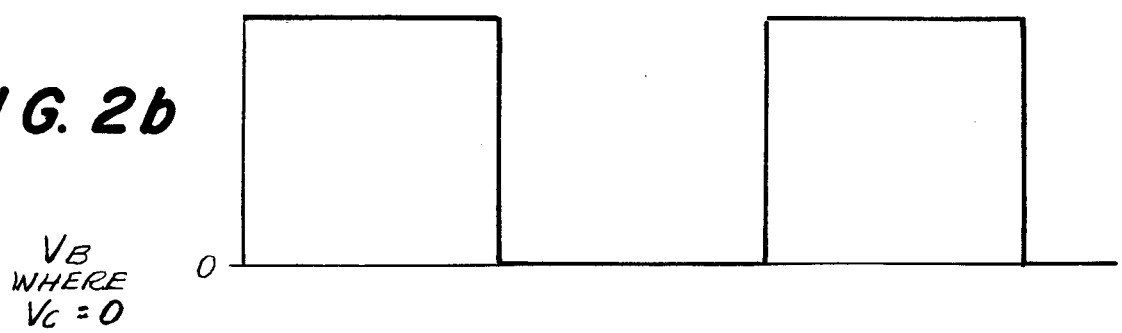

Square wave oscillator 50, diode 52, low-pass filter 70 and driver amplifier 71 shown in FIG. 1 are used to generate a sinusoidal alternating current test signal to a variable impedance load 60 (e.g. a capacitive liquid level sensor). The output of square wave oscillator 50, $V_A$ (see FIG. 2(a)), is a symmetrical square wave. $V_A$ is rectified by clamp diode 52 to produce a rectified square wave $V_B$ as shown in FIG. 2(b). This rectified square wave is filtered by low-pass filter 70. Low-pass filter 70 has a cut-off frequency at about the fundamental frequency of square wave signal $V_A$ and is effective to substantially prevent anything but the fundamental or first harmonic component of $V_A$ to pass through lowpass filter 70 leaving only a sinusoidal output signal $V_D$ (shown in FIG. 2(d)). The peak-to-peak amplitude of $V_D$ is proportional to the peak-to-peak amplitude of the rectified square wave $V_B$ as should be appreciated. Sinusoidal signal $V_D$ is conventionally amplified by driver amplifier 71 and is coupled through output transformer 138 to load 60.

The same $V_D$ is also applied to a simulated load 72 having the same general electrical characteristics as load 60 (e.g. a capacitor) but at some predetermined fixed impedance. The current output of simulated load 72 is rectified by diodes 74 and 76. Thus, the average current flowing through diode 74 is proportional to the product of the frequency and the amplitude of the AC current flowing through simulated load 72.

The current $I_s$ flowing through diode 74 is summed at node 80 with a constant reference current $I_{ref}$ produced by a highly-stable external fixed reference current source 78. $I_{ref}$ flows in a direction opposite that of $I_s$ at node 80 as shown. The amplitude of $I_{ref}$ is chosen to be equal to the average amplitude of $I_s$ at a desired nominal set point. $I_E$, which flows out of node 80, is an error current equal to the difference between the amplitudes of $I_s$ (which is proportional to the current flowing through simulated load 72) and reference current $I_{ref}$. Because the electrical impedance characteristics of simulated load 72 are constant, any change in average current flowing through simulated load 72 is attributable to changes in the frequency, amplitude or harmonic content of sinusoidal signal $V_D$ or to other changes affecting impedance measurements.

Figure 2C:
Figure 2D:
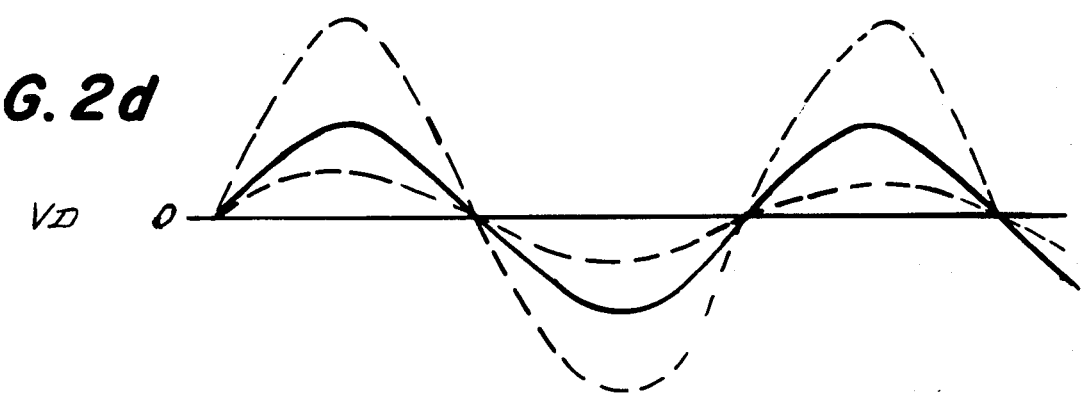

$I_E$ is applied to the input of an integrator 82. Integrator 82 produces a DC voltage level $V_C$ which changes proportionally to the change in accumulated (i.e. average) error current $I_E$. Whenever $I_s$ and $I_{ref}$ are not equal, integrator 82 receives a non-zero input current $I_E$ which causes output voltage level $V_C$ to change. $V_C$ is applied to summing node 58 through resistor 164 to clamp (with the help of diode 52) the negative peaks of square wave signal $V_A$ as is shown in FIG. 2(c).

If the current flowing through simulated load 72 decreases due to a decrease in the frequency, amplitude or harmonic content of sinusoidal signal $V_D$, average $I_s$ decreases. $I_E$, which is the average difference between $I_{ref}$ and $I_s$, changes from zero to a positive value. This increase in $I_E$ will, in turn, cause $V_C$ (the output of integrator 82) to decrease in amplitude. The decrease in amplitude of $V_C$ will increase the peak-to-peak amplitude of $V_B$. Because the peak-to-peak amplitude of sinusoidal signal $V_D$ is proportional to the peak-to-peak amplitude of rectified square wave signal $V_B$, the amplitude of $V_D$ will also increase, thus automatically compensating for the previous decrease in the current flowing through simulated load 72. $V_D$ then changes such that the average amplitudes of $I_s$ and $I_{ref}$ are once again equal so that average $I_E = 0$. Analogous compensation to decrease the amplitude of $V_D$ will result if the average current flowing through simulated load 72 increases.

Figure 3:
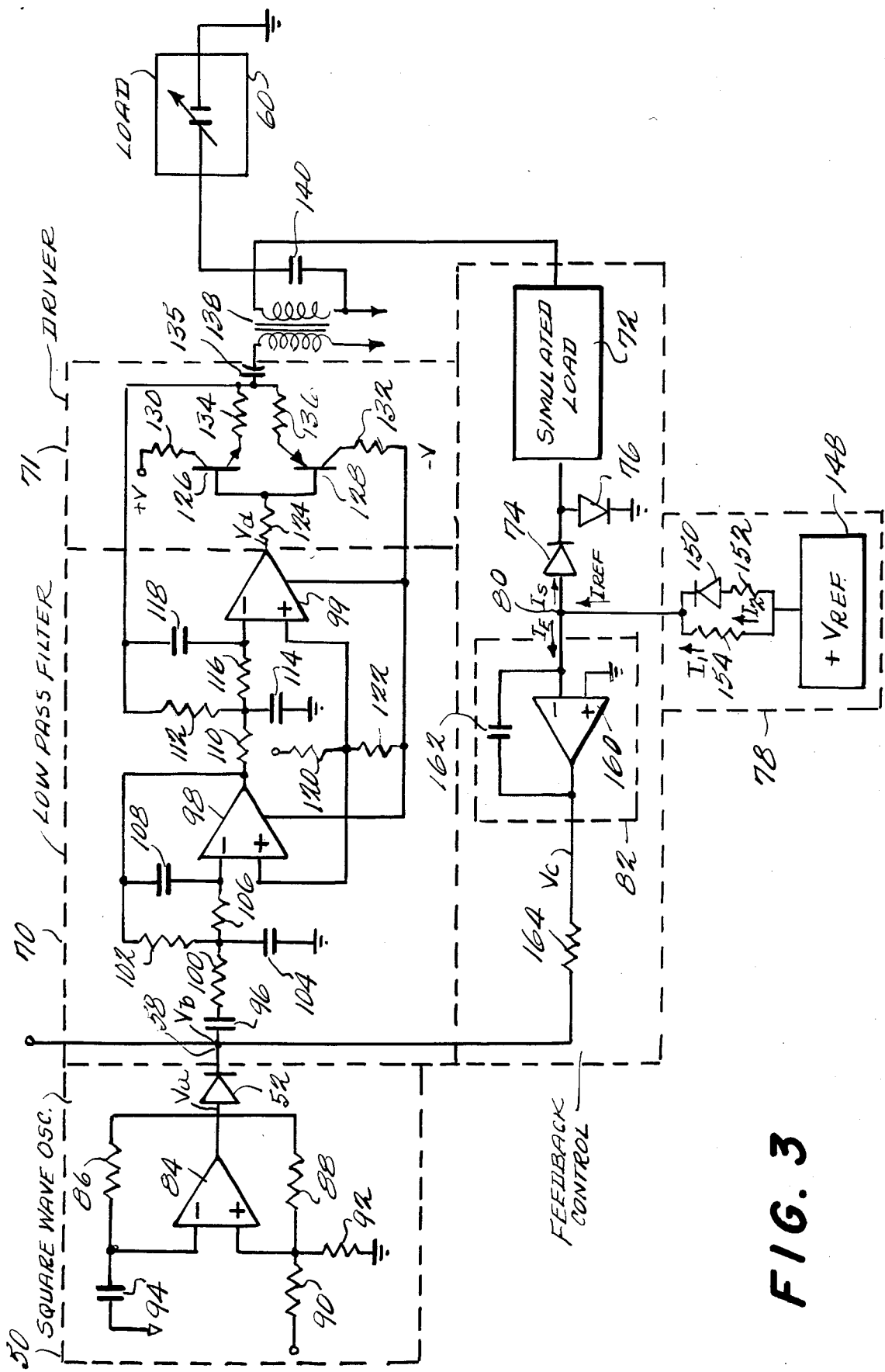
FIG. 3 is a detailed schematic diagram of the exemplary embodiment of FIG. 1.

Referring to FIG. 3, square wave oscillator 50 of the presently preferred exemplary embodiment may comprise a high slew rate operational amplifier 84, four precision resistors 86, 88, 90 and 92, and a precision capacitor 94. The values of resistors 86, 88, 90 and 92 and the value of capacitor 94 may be chosen, for example, to generate an output frequency of about 6.2 kilohertz. The tolerances of resistors 86, 88, 90 and 92 and capacitor 94 may be chosen so that the frequency stability of oscillator 50 is plus or minus 3%, resulting in no harmonics of 400 Hz (which may be important in an aircraft fuel gauge environment as will be appreciated). Operational amplifier 84 is run single-ended so that a negative power supply is not required (another advantage if a hybrid microcircuit is to be used). The square wave output $V_A$ of oscillator 50 may be buffered and used as a source for a negative voltage source.

Low-pass filter 70 may typically comprise two active cascaded filter stages. Operational amplifiers 98 and 99 are used as active elements. The filter response may be tailored to have a peak at 6.2 kilohertz, (i.e. the desired fundamental frequency of $V_A$), with a frequency roll-off of 80 dB/decade. Thus, such a low-pass filter 70 would provide 50 dB attentuation at the third harmonic. Six resistors 100, 102, 106, 110, 112 and 116 and five capacitors 96, 104, 108, 114 and 118 conventionally provide the desired frequency response of low-pass filter 70. Two resistors 120 and 122 conventionally bias operational amplifiers 98 and 99. The input of low-pass filter 70 may be capacitively coupled through capacitor 96 so that the entire low-pass filter may be powered by a single-ended 28 V.D.C. power supply.

A driver amplifier stage 71 may comprise a conventional push-pull amplifier with two transistors 126 and 128 as active elements. The bases of transistors 126 and 128 are connected together and coupled to the output of operational amplifier 99 through a resistor 124. The collector of transistor 126 is coupled to the positive connection of the DC power supply through a resistor 130. The collector of transistor 128 is coupled to the negative connection of the DC power supply through a resistor 132. The emitter of transistor 126 is connected through a resistor 134 and capacitor 135 to the primary winding of an output transistor 138. The emitter of transistor 128 is connected through a resistor 136 to the primary winding of output transformer 138. The primary winding of output transformer 138 is also connected to the junction of resistors 110 and 116 at the input of operational amplifier 99 of low-pass filter 70 to provide negative feedback to optimize overall filter performance.

Output transformer 138 is used to step up the output voltage to 20 volts rms. A capacitor 140 is connected across the secondary winding of output transformer 138. The capacitance of capacitor 140 is chosen so that the capacitive reactance of the capacitor plus that of the load capacitance (e.g. cable loading, EMI filters, etc.) is equal to the inductive reactance of the secondary winding of output transformer 138 at the frequency of $V_D$. The tuned Class C parallel resonance circuit thus formed will produce an output short circuit current less than the output current at normal operation, limiting the output current to a low level (which is especially important in an aircraft fuel gauging environment as will be appreciated). In addition, resistors 130, 132, 134 and 136 are chosen to limit output current to a desired value. Output coupling efficiency is increased by the parallel resonance circuit, allowing the use of long connecting lines between driver 71 and load 60.

An external reference current source 78 in accordance with the presently preferred exemplary embodiment may comprise a highly-stable fixed positive DC reference voltage source 148, a diode 150 and two resistors 152 and 154. Reference current source 78 provides reference current $I_{ref}$ to node 80 to be summed with $I_S$ to generate error current $I_E$. At a desired nominal set point, $I_{ref}$ is equal to $I_S$ such that $I_E = 0$.

Reference current source 78 includes temperature compensation so that $I_{ref}$ changes to compensate for any changes in $I_S$ due to changes in the voltage across diode 74 caused by temperature changes. The sum of the current flowing through resistor 154, $I_1$, and the current flowing through diode 150, $I_2$, is equal to the reference current $I_{ref}$:

$$I_1 + I_2 = I_{ref}$$

It is desirable that any change in $I_S$ due to a change in the temperature of diode 74 is accompanied by an identical opposite change in $I_{ref}$. Assuming that the change in voltage drop across any of diodes 74, 76 and 150 is the same for a given change in temperature, the value of resistor 152 is calculated to be equal to the change in the voltage across diode 74 due to temperature divided by the change in $I_s$ due to temperature:

$$R_{151} = \Delta V(\text{diode } 74)/\Delta I_s$$

Assuming for purposes of this derivation that load 60 is a variable pure capacitive reactance so that simulated load 72 is a fixed capacitor, the change in $I_s$ due to temperature is given by:

$$\Delta I_s = (2FC)\Delta V_{(\text{diode } 74)}$$

where F is the frequency of the output signal $V_D$ and C is the capacitance of simulated load 72. F is assumed to be constant. Thus, the resistance of resistor 151 is given by $$R_{151} = \Delta V_{(\text{diode } 74)}/\Delta I_s =$$

-continued $$\Delta V(\text{diode } 74)/2FC \, \Delta V(\text{diode } 74) = \frac{1}{2FC}$$

The resistance of resistor 154 is selected so that:

$$I_{ref} = I_1 + I_2 = I_S.$$

(at a desired nominal set point) $I_{ref}$ is given by:

$$I_{ref} = 2FCV_p - 2FCV(\text{diode } 74)$$

where $V_p$ is the desired peak value of the signal applied to load 60 at a desired nominal set point. $I_1$ is given by:ps
$$I_1 = V_{ref}/R_{154}$$

where $V_{ref}$ is the voltage output of reference voltage source 148. $I_2$ is given by:

$$I_2 = (V_{ref} - V_{(\text{diode } 150)}/R_{152}$$

Thus the value of resistor 154 is given by:

$$R_{154} = \frac{V_{ref}}{2FC(V_p - V_{ref})}$$

Integrator 82 in accordance with a presently preferred exemplary embodiment consists of an operational amplifier 160 and a capacitor 162. Capacitor 162 is connected between the inverting input and the output of operational amplifier 160. $I_E$, the difference between $I_S$ and $I_{ref}$, is applied to the inverting input of operational amplifier 160. The non-inverting input of operational amplifier 160 is grounded. The output of integrator 82 is connected to the cathode of clamping diode 52 through a resistor 164. The output voltage VC of integrator 82 is not zero when $I_E = 0$, but is a constant DC voltage proportional to the accumulated charge of capacitor 162. A change in $I_E$ will change the charge on capacitor 162, causing a change in the DC output voltage $V_C$ of integrator 82.

If Is decreases, $I_E$ flows into node 80, drawing charge from capacitor 162. The voltage across capacitor 162 decreases, decreasing $V_C$, the DC output of operational amplifier 160. Because the negative peaks of rectified square wave $V_B$ are clamped to the level of $V_C$, the peak-to-peak amplitude of $V_B$ increases. The peak-to-peak amplitude of $V_D$ likewise increases, increasing the amplitude of the signal applied to load 60 to compensate for the previous decrease.

If Is increases, $I_E$ will flow away from node 80 and into capacitor 162, increasing the charge on the capacitor. The voltage across capacitor 162 increases, increasing the voltage $V_C$ at the output of operational amplifier 160. The peak-to-peak amplitude of $V_B$ and thus the peak-to-peak amplitude of $V_D$ decreases. The amplitude of the signal applied to load 60 decreases to compensate for the previous increase.

The AC source 10 of this exemplary embodiment is especially suited for realization as a hybrid microcircuit as will now be appreciated by those in the art while yet providing the desired constant frequency-amplitude product output signal. The number of active elements has been minimized and the configuration of the circuit has been simplified to allow hybridization at low cost and high reliability. One presently preferred embodiment of AC source 10 places square wave oscillator 50, diode 52, low-pass filter 70, driver amplifier 71 and integrator 82 on a single monolithic integrated circuit.

Another presently preferred embodiment of AC source 10 places square wave oscillator 50, diode 52, low-pass filter 70, driver amplifier 71, simulated load 72, diodes 74, 76 and 150, and integrator 82 on a single monolithic integrated circuit.

Although only a few embodiments of this invention have been described in detail, those skilled in the art will readily appreciate that there are many ways to modify the disclosed system without materially changing the novel advantages, functions or results. Accordingly, all such modifications are intended to be included within the scope of this invention.

What is claimed is:

1. An amplitude-corrected signal source for inducing a fixed AC current in an element of a given fixed electrical impedance, said source comprising:
   a square wave oscillator for producing a square wave signal at its output;
   a first summing node;
   rectifier means connected between the output of the square wave oscillator and said first summing node for rectifying said square wave signal;
   low-pass filter means having an input connected to said first summing node for receiving said rectified square wave signal and for producing a corresponding alternating current sinusoidal signal;
   a second summing node having one input thereto connected to a terminal to receive a feedback current responsive to the amplitude and frequency of said sinusoidal signal and having another input connected to a terminal to receive a constant reference current of opposite polarity and to produce a resultant output error current; and
   an integrator having its input connected to receive said error current and an output connected to supply said first summing node with a direct current voltage level which changes as a function of the product of the amplitude and frequency of said sinusoidal signal.

2. A signal source as in claim 1 further comprising output amplifier means to amplify said sinusoidal signal.

3. A signal source as in claim 1 further comprising temperature compensation means for changing said constant reference current as a function of temperature to compensate for temperature changes.

4. An amplitude-corrected signal source for inducing a predetermined AC current in an element of a given electrical impedance, said source comprising:
   a square wave oscillator for producing a square wave signal at its output;
   a first summing node;
   rectifier means connected between the output of the square wave oscillator and said first summing node for rectifying said square wave signal;
   low-pass filter means having an input connected to said first summing node for receiving said rectified square wave signal and for producing a corresponding alternating current sinusoidal signal;
   simulated load means connected to receive said sinusoidal signal for simulating the electrical response of said element at a given electrical impedance;
   amplitude-frequency product to current converter means for producing a feedback current proportional to the product of the amplitude and frequency of the current flowing through said simulated load means;
   a second summing node having one input thereto connected to said current converter means to receive said feedback current and having another input connected to a terminal to receive a constant reference current of opposite polarity and to produce a resultant output error current; and
   an integrator having its input connected to receive said error current and an output connected to supply said first summing node with a direct current voltage level which changes with respect to the product of the amplitude and frequency of said sinusoidal signal.

5. A signal source as in claim 4 further comprising output amplifier means to amplify said sinusoidal signal.

6. A signal source as in claim 4 further comprising temperature compensation means for changing said constant reference current with respect to temperature to compensate for errors otherwise caused by changes in temperature.

7. An amplitude-corrected signal source for inducing a fixed AC current in an element of a given electrical impedance comprising:
   signal generating means for producing an alternating current sinusoidal signal which has an output controllable in amplitude in response to a supplied control voltage input;
   simulated load means connected to said sinusoidal signal for simulating the electrical response of said element at a given electrical impedance;
   current converter means for producing a feedback current proportional to the current flowing through said simulated load means;
   a summing node having one input thereto connected to said current converter means to receive said feedback current and having another input connected to a terminal to receive a constant reference current of opposite polarity and to produce a resultant output error current; and
   an integrator having its input connected to receive said error current and an output connected to supply said signal generator means with said control voltage input which changes as a function of the product of the amplitude and frequency of said sinusoidal signal so as to maintain said product substantially constant.

8. A signal source as in claim 7 further comprising temperature compensation means for changing said reference current to compensate for changes in temperature.

9. An amplitude-corrected signal source for inducing a fixed AC current in an element of a given electrical impedance, said source comprising:
   signal generating means for producing an alternating current sinusoidal signal of amplitude controlled by a control signal;
   simulated load means connected to said sinusoidal signal for simulating the electrical response of said element at a fixed predetermined impedance value;
   current converter means for producing a feedback current proportional to the product of the amplitude and frequency of the sinusoidal signal applied to said simulated load means;
   a summing node having as a first input a reference current which is caused to change as a function of temperature to compensate for changes in temperature and as a second input said feedback current; and
   an integrator having an input connected to said summing node and an output connected to supply said signal generating means with said control signal which changes as a function of the product of the amplitude and frequency of said sinusoidal signal.

* * * * *